(12) United States Patent
Chen et al.

(10) Patent No.: US 8,627,183 B1
(45) Date of Patent: Jan. 7, 2014

(54) SYSTEMS AND METHODS FOR STORING VARIABLE RATE PRODUCT CODES

(75) Inventors: Zhengang Chen, San Jose, CA (US); Xueshi Yang, Cupertino, CA (US)

(73) Assignee: Marvell International Ltd., Hamilton (BM)

(*) Notice: Subject to any disclaimer, the term of this patent is extended or adjusted under 35 U.S.C. 154(b) by 211 days.

(21) Appl. No.: 13/100,644

(22) Filed: May 4, 2011

Related U.S. Application Data

(60) Provisional application No. 61/333,522, filed on May 11, 2010.

(51) Int. Cl.
*H03M 13/00* (2006.01)

(52) U.S. Cl.
USPC .......................... 714/774; 714/758; 714/766

(58) Field of Classification Search
USPC ......................................... 714/774, 758, 766
See application file for complete search history.

(56) References Cited

U.S. PATENT DOCUMENTS

2008/0222490 A1* 9/2008 Leung et al. .................. 714/763
2010/0122148 A1* 5/2010 Flynn et al. .................. 714/773
2010/0253555 A1* 10/2010 Weingarten et al. ............ 341/51
2010/0293440 A1* 11/2010 Thatcher et al. ............... 714/764
2011/0191651 A1* 8/2011 Chen et al. .................... 714/755

OTHER PUBLICATIONS

Chuan-Sheng Lin; Kuang-Yuan Chen; Yu-Hsian Wang; Lan-Rong Dung; , "A NAND Flash Memory Controller for SD/MMC Flash Memory Card," Electronics, Circuits and Systems, 2006. ICECS '06. 13th IEEE International Conference on , vol., no., pp. 1284-1287, Dec. 10-13, 2006.*

Changgeun Kim; Sunwook Rhee; Juhee Kim; Yong Jee; , "Product Reed-Solomon Codes for Implementing NAND Flash Controller on FPGA Chip," Computer Engineering and Applications (ICCEA), 2010 Second International Conference on , vol. 1, no., pp. 281-285, Mar. 19-21, 2010.*

* cited by examiner

*Primary Examiner* — Cynthia Britt

(57) ABSTRACT

Systems and methods for storing variable rate product codes are provided. A plurality of row code parity symbols is stored on a storage unit. Each symbol of the row code parity symbols is associated with a different one of a plurality of equal sized portions of information. A plurality of column code parity symbols is computed. Each of the plurality of column code parity symbols is computed based on (1) a respective one of the plurality of row code parity symbols and (2) the portion of information associated with the respective one of the plurality of row code parity symbols. Each of the plurality of column code parity symbols corresponds to one of at least two code rates. The plurality of column code parity symbols is stored on the storage unit.

17 Claims, 5 Drawing Sheets

SYSTEMS AND METHODS FOR STORING VARIABLE RATE PRODUCT CODES

CROSS REFERENCE TO RELATED APPLICATION

This disclosure claims the benefit of U.S. Provisional Application No. 61/333,522, filed May 11, 2010, which is hereby incorporated by reference herein in its entirety.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

Traditional multi-level cell (MLC) NAND flash memory devices are prone to variable error rates within each device due to various conditions. For example, the locations of pages and bits within pages stored on the devices differ and thus are subject to different disturbances causing errors. Ways to reduce such variable error rates may include providing write precompensation or storing variable error correction codes (ECC).

However, such an error reduction schemes are insufficient to handle failures in flash devices beyond random bit errors or noise. More specifically, traditional error reduction schemes are insufficient to compensate for entire wordline failure, multiple page failure, charge pump failure, address decoder failure and/or block failure. One way to mitigate page/block failure may be to use redundant array of independent devices (RAID). However, RAID devices often cannot recover the data when there is more than a single page decoding failure. In addition, while storing variable ECC coding for different data sectors may mitigate such errors, the implementation of variable rate ECC coding in flash memory devices is difficult because these devices are configured to have fixed data sector and page sizes.

SUMMARY

In accordance with the principles of the present disclosure, systems and methods are provided for storing variable rate product codes, and more particularly to storing variable rate column codes in flash memory devices (e.g., NAND logic based memory devices or other volatile or non-volatile memory devices).

In some embodiments, a plurality of row code parity symbols may be stored on a storage unit. Each row code parity symbol of the row code parity symbols may be associated with a different one of a plurality of equal sized portions of information. In some implementations, each portion of the plurality of portions of information may correspond to a page of data. In some implementations, the storage unit may include a plurality of storage devices which may be of equal size. In some implementations, a total size of the plurality of portions of information may be predetermined and correspond to a maximum storage capacity of one of the plurality of storage devices. A plurality of column code parity symbols may be stored on the storage unit. In some implementations, the storage unit may be a flash memory that includes a plurality of NAND storage devices.

In some embodiments, a plurality of column code parity symbols may be computed. Each of the plurality of column code parity symbols may be computed based on (1) a respective one of the plurality of row code parity symbols and (2) the portion of information associated with the respective one of the plurality of row code parity symbols. In some implementations, each of the plurality of column code parity symbols may correspond to one of at least two different code rates. In some implementations, each column code parity symbol of the plurality of column code parity symbols that corresponds to a first of the at least two code rates may be of a first size corresponding to the size of one of the plurality of portions of information. Each column code parity symbol of the plurality of column code parity symbols that corresponds to a second of the at least two code rates may be of a second size corresponding to the size of two of the plurality of portions of information.

In some embodiments, the storage unit may include a plurality of equal sized storage devices. The plurality of row code parity symbols may be a first plurality of row code parity symbols that are stored in a first of a plurality of storage devices. The plurality of column code parity symbols may be stored in a second of the plurality of storage devices. A second plurality of row code parity symbols may be stored in a third of the plurality of storage devices. Each of the second plurality of row code parity symbols may be associated with a different one of another plurality of equal sized portions of information. Each of the another plurality of portions of information may be of a size equal to each of the plurality of portions of information.

In some implementations, a first column code parity symbol of the plurality of column code parity symbols may be computed based on (1) a first row code parity symbol from the first plurality of row code parity symbols, (2) the portion of information associated with the first row code parity symbol, (3) a second row code parity symbol from the second plurality of row code parity symbols, and (4) the portion of information associated with the second row code parity symbol. A second column code parity symbol of the plurality of column code parity symbols may be computed based on (1) a third row code parity symbol from the first plurality of row code parity symbols, (2) the portion of information associated with the third row code parity symbol, (3) a fourth row code parity symbol from the second plurality of row code parity symbols, and (4) the portion of information associated with the fourth row code parity symbol. The first column code parity symbol may correspond to a first of the at least two code rates and the second column code parity symbol may correspond to a second of the at least two code rates different from the first code rate. In some implementations, some but not all of the plurality of column code parity symbols include at least two portions, where a first of the at least two portions is stored in the second storage device and a second of the at least two portions is stored in a fourth of the plurality of storage devices.

In some embodiments, the storage unit may include a storage device with multiple planes. A first symbol of the plurality of row code parity symbols may include a first set of row code parity bits. Each subset of the first set of row code parity bits may be associated with a different equal sized segment of the portion of information that corresponds to the first symbol. A second symbol of the plurality of row code parity symbols may include a second set of row code parity bits. Each subset of the second set of row code parity bits may be associated with a different equal sized segment of the portion of information that corresponds to the second symbol. The first and second row code parity symbols may be stored in each of the multiple planes. A first of the plurality of column code parity symbols may be stored only in one of the multiple planes and a second of the plurality of column code parity symbols may be stored in each of the multiple planes.

In some embodiments, one of the at least two code rates may be selected for computing each of the column code parity symbols based on a storage location of the respective one of the plurality of row code parity symbols in the storage unit.

BRIEF DESCRIPTION OF THE DRAWINGS

The above and other features of the present disclosure, its nature and various advantages will be more apparent upon consideration of the following detailed description, taken in conjunction with the accompanying drawings in which.

DETAILED DESCRIPTION

This disclosure generally relates to storing variable rate product codes. For illustrative purposes, this disclosure is described in the context of flash memory devices that are NAND logic based. It should be understood, however, that this disclosure is applicable to any other suitable volatile or non-volatile memory device having fixed block sizes with dedicated data and parity information regions (e.g., MLC NAND flash memory, phase change memory, or magnetoresistive random access memory (MRAM)).

Figure 1:
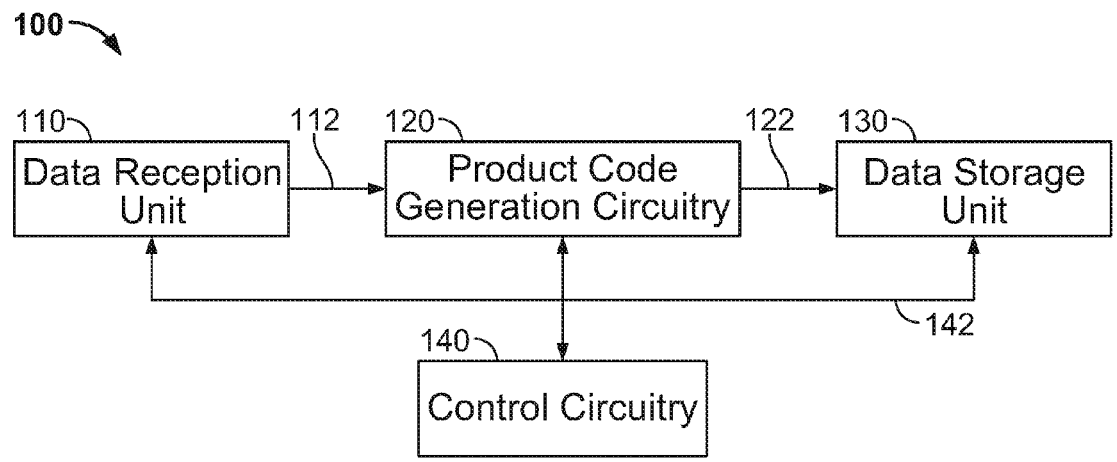
FIG. 1 is a diagram of an illustrative variable rate product codes system in accordance with an embodiment of the present disclosure.

FIG. 1 is a diagram of an illustrative variable rate product codes system 100 in accordance with an embodiment of the present disclosure. System 100 includes a data reception unit 110, product code generation circuitry 120, data storage unit 130 and control circuitry 140. Although the components shown in system 100 are drawn separately, the components may be implemented as separate devices on different integrated circuit (IC), as separate devices on the same IC, or any combination thereof. In addition, the components of system 100 may together be housed and used by a particular internal or external device or may be individually and independently used by internal or external devices. For example, system 100 may be a universal serial bus (USB) data storage system.

Data reception unit 110 may be any suitable device or circuitry that is used to receive data. In some implementations, data reception unit 110 may be a receiver coupled or connected to an antenna. The receiver may demodulate, decode and output an information signal 112. In some implementations, data reception unit 110 may be a storage device (e.g., a hard disk drive, random access memory (RAM) device, read only memory (ROM) device, flash storage device, or any other suitable volatile or non-volatile storage device). The storage device may be instructed by control circuitry 140 to read a section of data and may output the data as information signal 112. In some implementations, data reception unit 110 may include a software application that outputs information signal 112 for subsequent storage on data storage unit 130. In some implementations, data reception unit 112 may include USB communication components that are configured to receive data from an external component (e.g., a laptop, desktop, mobile phone or mobile device) and output information signal 112 that includes the data received from the external component.

Information signal 112 may include data bits. The data bits in information signal 112 may be organized according to pages or page sizes. As defined herein, the term page or page size identifies the maximum amount of bits a storage device is configured to store for a given set of address locations. In particular, information signal 112 may be separated into pages of data bits having a predetermined size. The predetermined size of the pages may depend on the page size that data storage unit 130 is configured to store. In some implementations, the page size may be set by a manufacturer of data storage unit 130. The number of user data per page (which may be specified in bytes), not including spare data (e.g., parity information, metadata or error correction code parity), is usually specified as a power of two. The number of spare data per page may also be specified by a manufacturer of data storage unit 130. For example, one page may correspond to 8192+320 bytes of storage, where 8192 bytes are designated for user data and 320 bytes are designated for spare data.

For example, data storage unit 130 may include a flash memory device that has one or more blocks of storage each configured to store a certain number of pages of data. The pages of data may each be 64 kilobytes in size. Accordingly, information signal 112 may be organized in pages each having 64 kilobytes of data. In some embodiments, a total size of the data in information signal 112 may correspond to the total number of pages that a particular block of the flash memory device is capable of storing. In some embodiments, data storage unit 130 may include multiple flash memory devices. In such circumstances, a total size of the data in information signal 112 corresponds to the total number of pages that all the flash memory devices in combination are capable of storing.

Control circuitry 140 may be coupled to data storage unit 130 over communications link 142 and may determine the number of flash memory devices in data storage unit 130 and the characteristics of those devices (e.g., the maximum page and block size of each device). Control circuitry 140 may be coupled to data reception unit 110 over communications link 142 and may inform data reception unit 110 of the number of flash memory devices in data storage unit 130 and the characteristics of those devices. In some embodiments, data reception unit 110 may be coupled directly to data storage unit 130 and may determine the number of flash memory devices in data storage unit 130 and the characteristics of those devices without control circuitry 140.

Product code generation circuitry 120 receives information signal 112 and generates a variable rate product code based on the data in information signal 112. A product code includes row code parities and column code parities. The row code parities correspond to different pages in devices and the column code parities cover data from more than one page. Storing row code parities and column code parities is referred to as a product code since the column code parities are computed based on the data in the pages and the row code parities (i.e., parity on parity codes).

In some embodiments, product code generation circuitry 120 may compute row code parity symbols for different portions of data in information signal 112. In some implementations, each of the portions of data in information signal 112 is of equal size corresponding to a page size used in data storage unit 130. For example, each portion of data in information signal 112 may correspond to 1 page 192 pages of total data and accordingly, 192 row code parity symbols may be computed for the total data in information signal 112. Product code generation circuitry 120 may compute the row code parity symbols in accordance with any suitable error correction coding algorithm (e.g., any systematic or non-systematic code, such as a Hamming code, BCH code, Reed-Solomon Code, Low-density-parity code or any other suitable block code or convolutional code algorithm). As used herein, the phrase "row code parity symbol", is interchangeable with the phrase "row code", and refers to parity data computed for a segment of user data stored on a storage device, where the segment of user data includes one or more pages of the user data or a predetermined amount of user data.

Product code generation circuitry 120 may compute column codes based a respective one of the plurality of row code parity symbols and the portion of information associated with the respective one of the plurality of row code parity symbols. Product code generation circuitry 120 may compute the column codes in accordance with any suitable error correction coding algorithm (e.g., any systematic or non-systematic code, such as a Hamming code, BCH code, Reed-Solomon Code, Low-density-parity code or any other suitable block code or convolutional code algorithm). As used herein, the phrase "column code parity symbol", is interchangeable with the phrase "column code", and refers to parity data computed for both multiple segments of user data stored on a storage device and any parity data associated with each of the segments (such as a row code parity symbol associated with each respective segments), where each segment of user data includes one or more pages of the user data or a predetermined amount of user data.

Each of the computed column codes may correspond to one of at least two different code rates. For example, one code rate may produce a column code that occupies two pages of data on the flash memory device for every 32 total pages of data that are stored. A second code rate may produce a column code that occupies one page of data on the flash memory device for every 32 pages of data that are stored. Higher coding rates correspond to weaker or smaller column codes. In particular, a column code that occupies two pages of data may be stronger and more reliable than a column code that occupies one page of data. The code rate may be inversely proportional to the size of the column code.

Control circuitry 140 may be coupled to product code generation circuitry 120 to select the code rate that is used for a particular portion of information signal 112. A particular code rate may be selected based on the needs of an application. For example, an application that requires more reliability in the data, may require low code rates to be selected in computing the column codes more frequently than high code rates. The result is more storage in data storage unit 130 being used by the column codes than user data and row parity symbols. In some implementations, the code rate may be selected based on the storage location in data storage unit 130 (e.g., a location within a block of a given flash memory device) of a page of data or portion of information signal 112.

In some embodiments, the row code parity symbols are each fixed in size because the flash memory storage devices in data storage unit 130 have a fixed user sector size and physical page size limitation. More specifically, each page of user data has a predetermined amount of storage space dedicated to the row code parity symbol. In particular, the row code parity symbols are stored together with the user data on a given page. However, the column codes may vary in size or code rate since the column codes are stored on a page independent of the user data. More specifically, instead of storing the column code with a page of data, like the row code parity symbols, the column code may be stored entirely on a full page or multiple pages and may therefore be of any suitable size.

In some implementations, a first set of flash memory storage devices (e.g., 6 storage devices) of data storage unit 130 are configured to store pages that include user data and row code parity symbols for the user data. In addition, a second set of flash memory storage devices (which may be of equal or larger size) of data storage unit 130 is configured to store column codes for the pages of data and row code parity symbols stored on the one or more flash memory storage devices. In some embodiments, at least one of the flash memory devices in the second set shared with the first set of flash memory storage devices and is therefore configured to store in some sections user data and row code parity symbols for the user data and in other sections other portions of column codes for the user data and row code parity symbols.

Product code generation circuitry 120 outputs storage signal 122 that may include pages of information corresponding to portions of information received from data reception unit 110, the row code parity symbols for each portion of information and the column codes that are computed. In some implementations, product code generation circuitry 120 outputs pages of data, where some pages include user data and a row code parity symbol and other pages include a column code or portions of a column code. Data storage unit 130 may store the portions of information on pages of one or more flash memory devices. Data storage unit 130 may include multiple flash memory devices or a single flash memory device with multiple planes. Data storage unit 130 is discussed in more detail below in connection with FIGS. 3-5.

Data storage unit 130 may be any standalone or integrated electronic storage component or device. Data storage unit 130 may include any number of memory devices. The memory devices in data storage unit 130 may all be flash memory devices (e.g., NAND based flash storage devices) or a combination of flash memory devices and other non-flash storage devices (e.g., ROM, RAM, or any other suitable electronic storage device).

Figure 2:
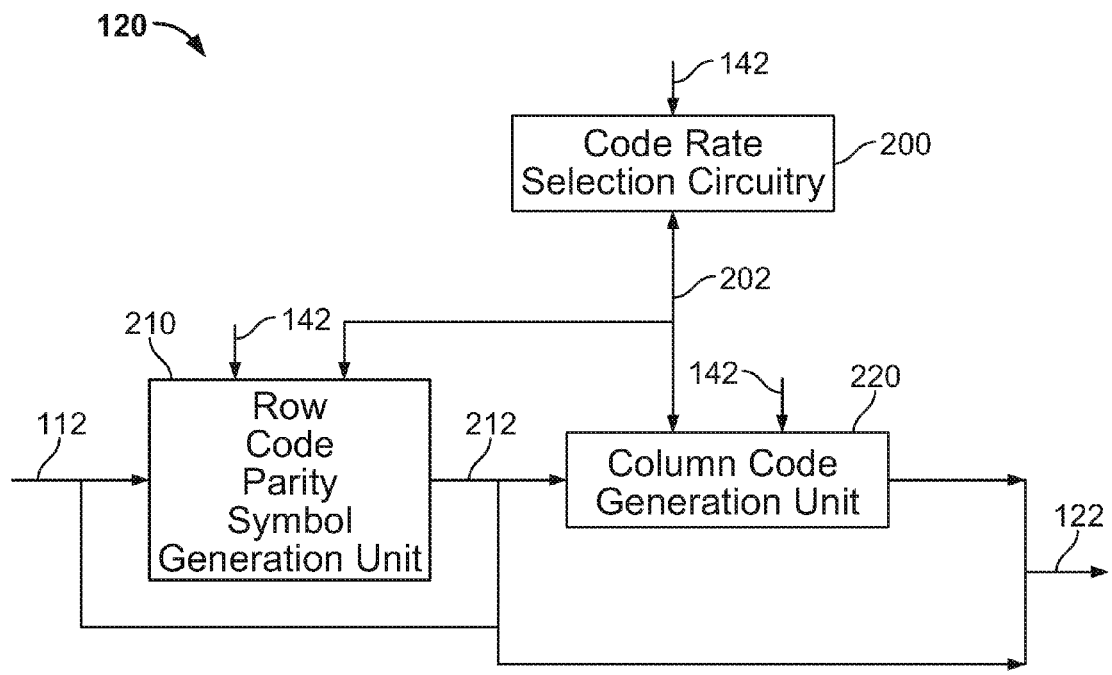
FIG. 2 is a diagram of an illustrative product code generation circuitry in accordance with an embodiment of the present disclosure.

FIG. 2 is a diagram of an illustrative product code generation circuitry 120 in accordance with an embodiment of the present disclosure. Product code generation circuitry 120 includes code rate selection circuitry 200, row code parity symbol generation unit 210 and column code generation unit 220. Row code parity symbol generation unit 210 receives information signal 112 and control signal 142. Row code parity symbol generation unit 220 computes a row code parity symbol for each of a plurality of different equal sized portions of information signal 112.

In some embodiments, control signal 142 may indicate to row code parity symbol generation unit 210 the page size and/or block size of the storage device of data storage unit 130. Based on the information provided by control signal 142, row code parity symbol generation unit 210 may determine or package information signal 112 into the appropriately sized page sizes that correspond or are identical to the page sizes or block sizes of the storage devices. In some implementations, information signal 112 is delivered to row code parity symbol generation unit 210 as pages of data that correspond to the page sizes or block sizes of the storage devices in storage unit 130. Row code parity symbol generation unit 210 may include encoder or error correction circuitry configured to perform a coding algorithm for computing parity information (e.g., row code parity symbol) for a given portion of information signal 112.

For example, when the portion of information signal 112 is a page size of data, row code parity symbol generation unit 220 computes parity information for that page of data. Portion of information signal 112 may include any number of pages of data. When portions of information signal 112 includes multiple pages of data, row code parity symbol includes multiple sets of parity information, where each set is computed for a given one of the pages of data. In some implementations, the row code parity symbol may include a single set of parity bits computed based on the entire portion of information signal that includes multiple pages. In such circumstances, the row code parity symbol may be equally distributed among the free space in the pages allocated for error correction.

In some embodiments, row code parity symbol generation unit 210 may include multiple encoders or error correction code generation circuitries. In such circumstances, row code parity symbol generation unit 210 may generate row code parity symbols for multiple portions of information signal 112 simultaneously. For example, row code parity symbol generation unit 210 may generate parity bits for each of multiple pages of data simultaneously. In such circumstances, row code parity symbol generation unit 210 may output all of the simultaneously computed row code parity symbols and portions of information signal 112 to column code generation unit 220. The portion of information signal 112 corresponding to a given row code parity symbol may be configured to be stored across the same page of multiple storage devices, multiple different pages of multiple storage device and/or multiple planes of a single data storage device of data storage unit 130.

Code rate selection circuitry 200 may receive control signal 142 and may select between a plurality of code rates based on the control signal 142. In some implementations, code rate selection circuitry 200 may be coupled to row code parity symbol generation unit 210 via communications path 202. Row code parity symbol generation unit 210 may indicate to code rate selection circuitry 200 which page of data is currently being encoded (e.g., which page of data of information signal 112 is being processed for computing row code parity symbols). Based on the indication received from row code parity symbol generation unit 210, code rate selection circuitry 200 may determine the storage location corresponding to the page of data being processed and may select between the plurality of code rates based on the storage location of the page of data.

Code rate selection circuitry 200 may be coupled via communications path 202 to column code generation unit 220. Code rate selection circuitry 200 may indicate via communications path 202 to column code generation unit 220 which code rate to use to encode a given set of row code parity symbols and portion of information signal 112. In some implementations, column code generation unit 220 may include multiple error correction code circuitries each configured to encode data at a different rate. Each of the multiple error correction code circuitries may be coupled to receive the row code parity symbols and portions of information signal 112 and generate a column code at the corresponding rate. The outputs of each of the error correction code circuitries may be coupled to a multiplexer or selection circuit which is controlled by a signal received from code rate selection circuitry 200. In some implementations, column code generation unit 220 may include a single error correction code circuitry that is configured to and is capable of encoding data at multiple code rates. In such circumstances, the code rate of the multiple code rates used by the single error correction code circuitry may be selected by a code rate selection input signal.

For example, the data inputs of the multiplexer or selection circuit may be coupled respectively to the outputs of the error code correction circuitries and the control input of the multiplexer or selection circuit may be coupled to an output signal of code rate selection circuitry 200. Accordingly, when a high code rate is needed for a given set of row code parity symbols and corresponding portion of information signal 112, code rate selection circuitry 200 may select the input of the multiplexer corresponding to the output of the high code rate error code correction circuitry for output to storage unit 130. Alternatively, when a low code rate is needed for a given set of row code parity symbols and corresponding portion of information signal 112, code rate selection circuitry 200 may instead select the input of the multiplexer corresponding to the output of the low code rate error code correction circuitry for output to storage unit 130.

Row code parity symbol generation unit 210 outputs row code parity symbols that are computed along with the equal sized portions of information signal 112 corresponding to the computed row code parity symbols via communications path 212 to column code generation unit 220. Column code generation unit 220 may compute a column code based on one of the portions of information signal 112 and the row code parity symbol corresponding to the portion of information signal 112 using a selected one of at least two code rates. For example, column code generation unit 220 may receive 30 pages of user data as the portion of information signal 112 and a set of 30 row code parity bits each corresponding to a respective one of the 30 pages of user data as the row code parity symbol. Column code generation unit 220 may compute a column code using, for example, a high code rate based on the 30 pages of user data and the set of 30 row code parity bits. The column code may be two pages in size. Similarly, column code generation unit 220 may receive 29 pages of user data as another portion of information signal 112 and a set of 29 row code parity bits each corresponding to a respective one of the 29 pages of user data as the row code parity symbol. Column code generation unit 220 may compute a column code using, for example, a low code rate based on the 29 pages of user data and the set of 29 row code parity bits.

In some embodiments, column code generation unit 220 may include a first set of encoders or error correction circuitries having one coding rate and a second set of encoders or error correction circuitries having a different coding rate. Alternatively, one set of multiple encoders or error correction circuitries that support multiple coding rates (selected using a signal received from code rate selection circuitry 200) may be provided in column code generation unit 220. The set of encoders or error correction circuitries may operate on different portions of information signal 112 and corresponding row code parity symbols in parallel to compute column codes for those portions and row code parity symbols simultaneously.

In some embodiments, control signal 142 may indicate to column code generation unit 220 the page size and/or block size of the storage device of data storage unit 130. Based on the information provided by control signal 142, column code generation unit 220 may determine or package the computed column code into the appropriately sized page sizes that correspond or are identical to the page sizes or block sizes of the storage devices.

The outputs of row code parity symbol generation unit 210 and column code generation unit 220 may be combined for storage at the designated locations in data storage unit 130. In particular, the portion of information signal 112 and the corresponding row code parity symbol may be output to data storage unit 130 for storage in one or more pages of one or more storage devices and the column code may be output to data storage unit 130 for storage in one or more other pages of one or more storage devices. The output to data storage unit 130 may be on a burst cycle basis where all of the pages for each of the storage devices in data storage unit 130 are stored or sent for storage simultaneously. Alternatively, the pages may be sent by each of row code parity symbol generation unit 210 and column code generation unit 220 individually as they are computed or generated to a particular storage device of data storage unit 130.

Figure 3:
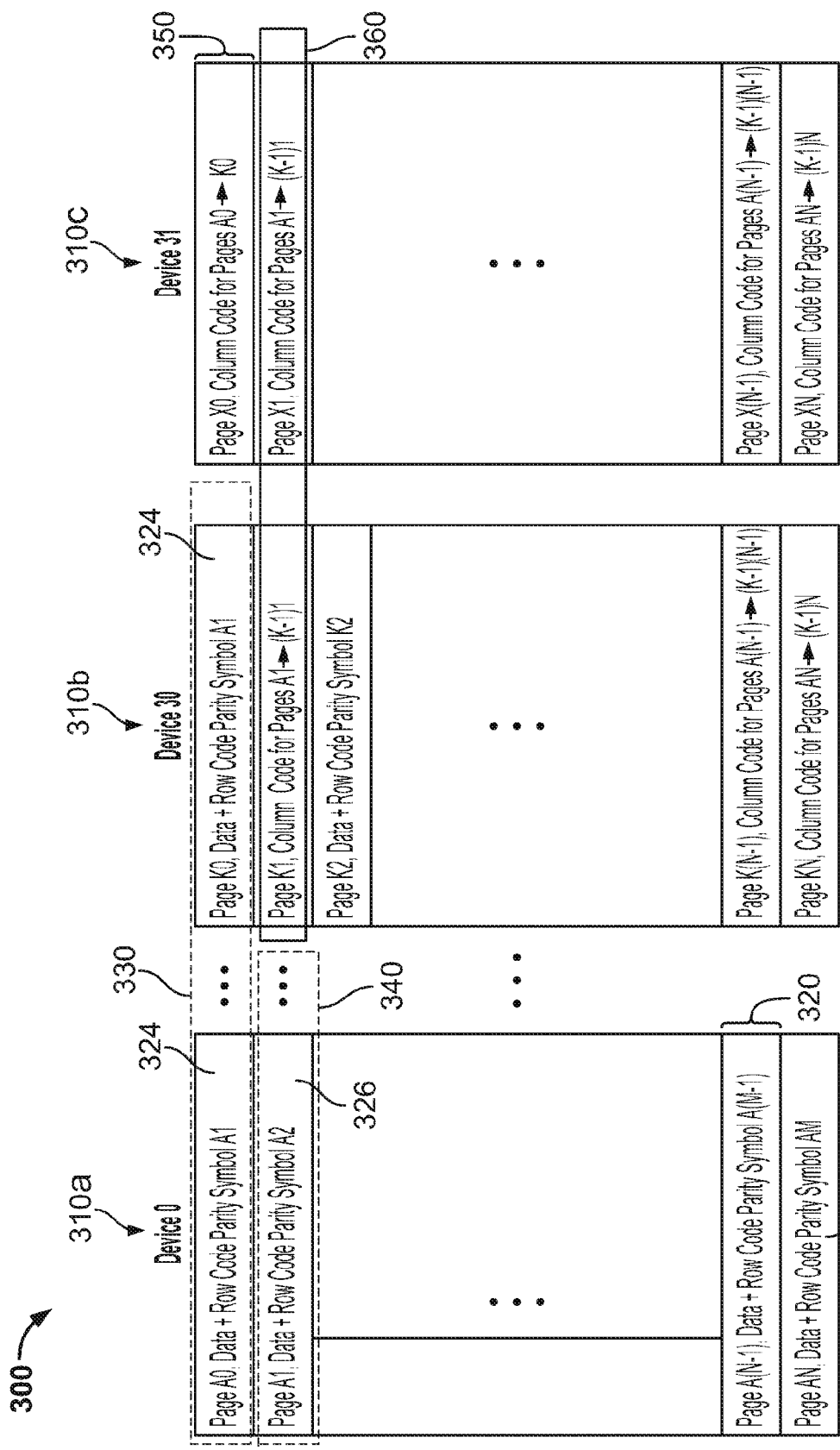
FIGS. 3-5 are diagrams of an illustrative data storage unit in accordance with various embodiments of the present disclosure.
Figure 4:
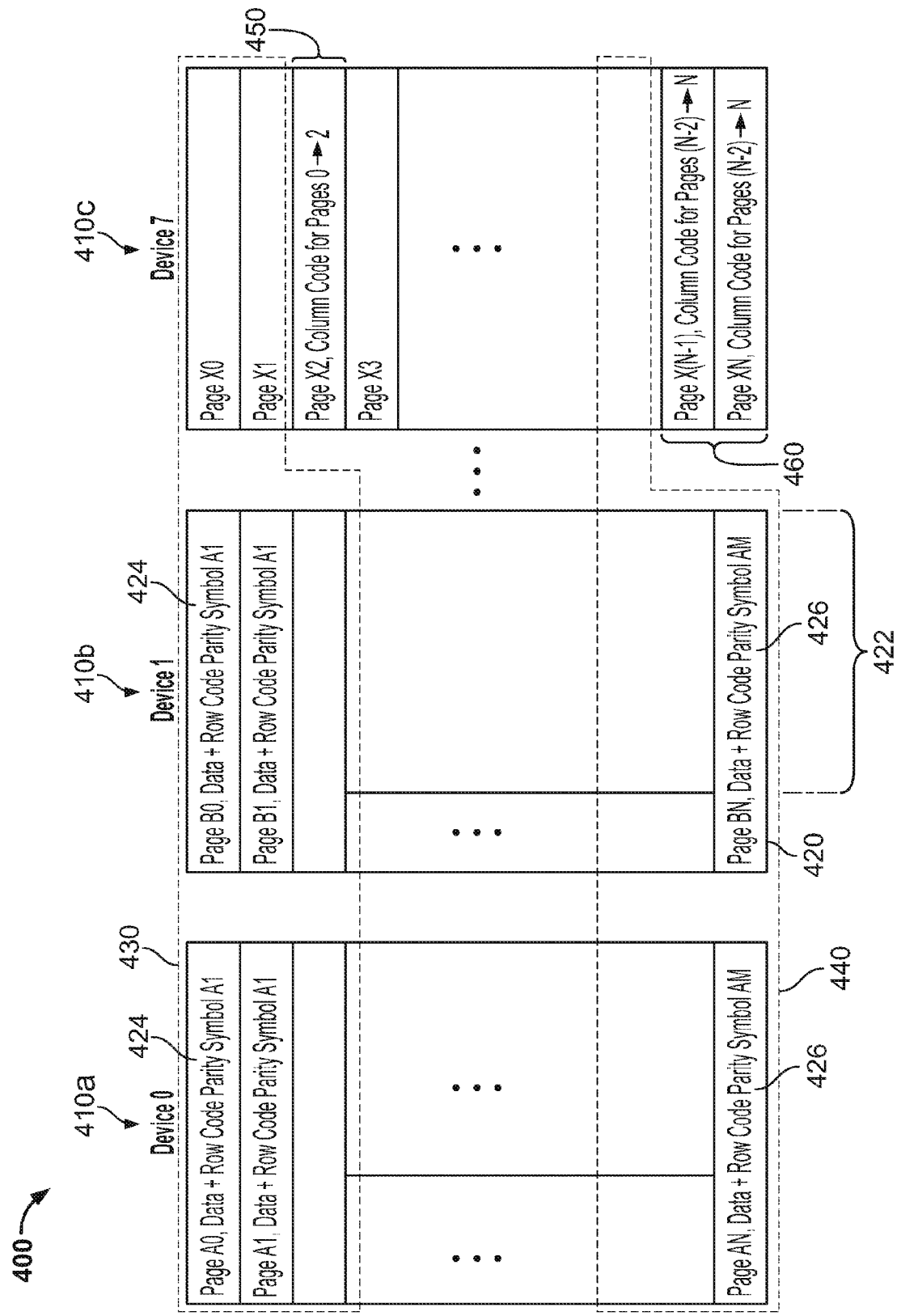
Figure 5:
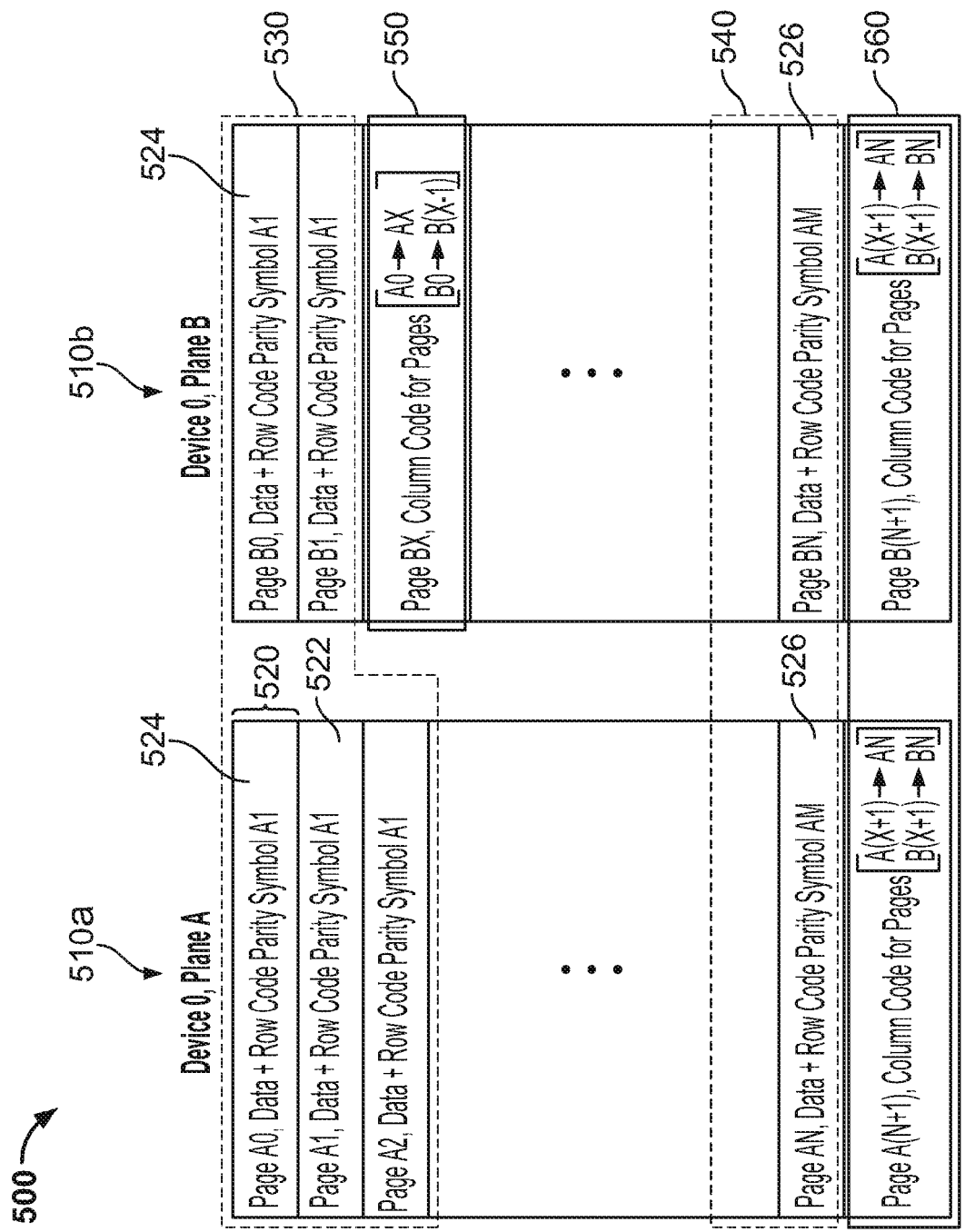

FIGS. 3-5 are diagrams that collectively illustrative data storage unit 130 in accordance with various embodiments of the present disclosure. In particular, each of FIGS. 3-5 represents a different way in which a data segment for which a row code parity symbol is computed and for which the column code is computed are arranged in data storage unit 130. In particular, in FIG. 3, each data segment includes a single row across multiple storage devices, where the row code parity symbol is stored with each page of data and the column code for that segment and row code parity symbols is stored in the same row of one of the storage devices as the data segment and row code parity symbol. In FIG. 4, each data segment includes a set of rows across multiple storage devices and a set of columns of those rows across the multiple devices, where the row code parity symbol is stored with each page of data and the column code for that segment and row code parity symbols may be stored in an adjacent row and one or more columns of one of the storage devices. In FIG. 5, each data segment includes a set of rows across multiple planes of a storage device and a set of columns of those rows across the multiple planes, where the row code parity symbol is stored with each page of data and the column code for that segment and row code parity symbols may be stored in an adjacent row and one or more columns of one of the planes of the storage device.

FIG. 3 is a diagram 300 of an illustrative data storage unit 130 in accordance with an embodiment of the present disclosure. Data storage unit 130 may include storage devices 310*a-c*. Storage devices 310*a-c* may include any NAND storage devices (e.g., flash memory, MLC NAND storage devices, or other suitable electronic volatile or non-volatile storage device). Storage devices 310*a-c* are each configured to store data in blocks, where each block stores one or more pages 320. In some embodiments, data storage unit 130 includes 32 identical storage devices 310, where each of the identical storage devices is configured to store 192 pages per storage block.

In some embodiments, product code generation circuitry 120 may store a first portion of information 330 of information signal 112 in storage devices 310*a-b*. In some implementations, first portion of information 330 may include 31 pages of data. Product code generation circuitry 120 may compute a first row code parity symbol 324 for first portion of information 330 and store first row code parity symbol 324 in storage devices 310*a-b* together with first portion of information 330. For example, first row code parity symbol 324 may include multiple sets of row code parity bits that are computed by row code parity symbol generation unit 210. The number of sets of row code parity bits may correspond to and be the same as the number of pages in first portion of information 330. In some implementations, each set of row code parity bits 322 may be appended or stored together with a corresponding page 320 of first portion of information 330.

In some embodiments, first portion of information 330 may be stored in one block of each storage device 310*a-b* at the first page of each storage device 310*a-b*. For example, first portion of information 330 may include 31 pages of data. The 31 pages of data may be spread across the first page of storage location of each of 31 storage devices 310*a-b*. Similarly, first row code parity symbol 324 including the sets of row code parity bits may be stored together with first portion of information 330 across the first page of each storage device 310*a-b*.

In some embodiments, product code generation circuitry 120 may compute a first column code 350 based on first portion of information 330 and first row code parity symbol 324. Product code generation circuitry 120 may be instructed to compute first column code 350 based on a first code rate (e.g., a high code rate corresponding to a weak column code). Accordingly, first column code 350 may be one page in size. Product code generation circuitry 120 may store first column code 350 in storage device 310*c*.

In some implementations, first column code 350 may be stored at a page of storage device 310 that corresponds to the locations at which first portion of information 330 and first row code parity symbol 324 are stored. In particular, when first portion of information 330 and first row code parity symbol 324 are stored across the first page of each storage device 310*a-b*, first column code 350 may be stored at the first page of storage device 310*c*.

In some embodiments, product code generation circuitry 120 may store a second portion of information 340 of information signal 112 in storage devices 310*a-b*. In some implementations, second portion of information 340 may include 30 pages of data. In some implementations, second portion of information 340 may include 31 pages of data. In some implementations, each portion 330 and 340 of information may be of an identical size.

Product code generation circuitry 120 may compute a second row code parity symbol 326 for second portion of information 340 and store second row code parity symbol 326 in storage devices 310*a-b* together with second portion of information 340. Second row code parity symbol 326 may be identical in size as first row code parity symbol 324. The sizes of first and second row code parity symbols 324 and 326 may be constrained and predetermined based on the configuration and page size of each storage device 310*a-b*. For example, second row code parity symbol 326 may include multiple sets of row code parity bits that are computed by row code parity symbol generation unit 210. The number of sets of row code parity bits may correspond to and be the same as the number of pages in second portion of information 340. In some implementations, each set of row code parity bits may be appended or stored together with a corresponding page of second portion of information 340.

In some embodiments, second portion of information 340 may be stored in one block of each storage device 310*a-b* at a next available free page (e.g., the second page) of each storage device 310*a-b*. For example, second portion of information 340 may include 30 or 31 pages of data. The 30 or 31 pages of data may be spread across the second page of storage location of each of 30 or 31 storage devices 310*a-b*. Similarly, second row code parity symbol 326 including the sets of row code parity bits may be stored together with second portion of information 340 across the second page of each storage device 310*a-b*.

In some embodiments, product code generation circuitry 120 may compute a second column code 360 based on second portion of information 340 and second row code parity symbol 326. Product code generation circuitry 120 may be instructed to compute second column code 360 based on a second code rate (e.g., a slow code rate corresponding to a strong column code). The second code rate used to generate second column code 360 may be slower than the first code rate used to generate first column code 350. Accordingly, second column code 360 may be larger than first column code 350. For example, second column code 360 may be two pages in size. Product code generation circuitry 120 may store second column code 360 in storage devices 310b and 310c. In particular, because second column code 360 is larger than a page size of storage device 310c, second column code 360 may be partitioned into at least two portions where a first portion of second column code 360 is stored in one storage device 310b and a second portion of second column code 360 is stored in another storage device 310c.

In some embodiments, the pages of at least one of storage devices 310a-c may be used to store (1) pages or segments of portions of information 330 and 340 with corresponding sets of row code parity bits of first and second row code parity symbols 324 and 326 as well as (2) portions of column codes (e.g., second column code 360). In some implementations, the pages of at least one of storage devices 310a-c may be used to exclusively or only store pages or segments of portions of information 330 and 340 with corresponding sets of row code parity bits of first and second row code parity symbols 324 and 326. In some implementations, the pages of at least one of storage devices 310a-c may be used to exclusively or only store portions of column codes (e.g., second column code 360) or entire column codes (e.g., first column code 350).

In some implementations, each portion of second column code 360 may be stored at a page of storage devices 310b-c that corresponds to the locations at which second portion of information 340 and second row code parity symbol 326 are stored. In particular, when second portion of information 340 and second row code parity symbol 326 are stored across the second page of some of storage devices 310, each portion of second column code 360 may be stored at the second page of each storage device 310b-c.

In some embodiments, the last two portions of information stored in data storage unit 130 may be configured to have low code rate column codes computed and stored. In such circumstances, each of the last two portions of information may each include 30 pages of data stored across the last two pages of each storage device 310. In addition, the column codes computed based on the last two portions of information and corresponding row code parity symbols may be at least two pages in size. Accordingly, each portion of the last two column codes may be stored across the last two pages of each storage device 310b and 310c.

FIG. 4 is a diagram 400 of an illustrative data storage unit 130 in accordance with an embodiment of the present disclosure. Data storage unit 130 may include storage devices 410a-c. Storage devices 410a-c may include any NAND storage devices (e.g., flash memory, MLC NAND storage devices, or other suitable electronic volatile or non-volatile storage device). Storage devices 410a-c are each configured to store data in blocks, where each block stores one or more pages 420. In some embodiments, data storage unit 130 includes 8 identical storage devices 410, where each of the identical storage devices is configured to store 192 pages per storage block.

In some embodiments, product code generation circuitry 120 may store a first portion of information 430 of information signal 112 in storage devices 410a-c. In some implementations, first portion of information 430 may include 23 pages of data. Product code generation circuitry 120 may compute a first row code parity symbol 424 for first portion of information 430 and store first row code parity symbol 424 in storage devices 410a-c together with first portion of information 430. For example, first row code parity symbol 424 may include multiple sets of row code parity bits that are computed by row code parity symbol generation unit 210. The number of sets of row code parity bits may correspond to and be the same as the number of pages in first portion of information 430. In some implementations, each set of row code parity bits 422 may be appended or stored together with a corresponding page 420 of first portion of information 430. Row code parity bits 422 may include more or less bits than user data stored in page 420.

In some embodiments, first portion of information 430 may be stored in one block of each storage device 410a-b at the first, second and third pages of each storage device 410a-b. For example, first portion of information 430 may include 23 pages of data. The 23 pages of data may be spread across the first, second and third pages of storage locations of each of 8 storage devices 410 and the first and second pages of storage locations of another storage device 410. Similarly, first row code parity symbol 424 including the sets of row code parity bits may be stored together with first portion of information 430 across the first, second and third pages of storage locations of each of 8 storage devices 410 and the first and second pages storage locations of another storage device 410.

In some embodiments, product code generation circuitry 120 may compute a first column code 450 based on first portion of information 430 and first row code parity symbol 424. Product code generation circuitry 120 may be instructed to compute first column code 450 based on a first code rate (e.g., a high code rate corresponding to a weak column code). Accordingly, first column code 450 may be one page in size. Product code generation circuitry 120 may store first column code 450 in storage device 410c. In some implementations, first column code 450 may be stored in the next page of storage location following first portion of information 430 (e.g., the third page storage location of storage device 410c).

In some embodiments, product code generation circuitry 120 may store a second portion of information 440 of information signal 112 in storage devices 410a-c. In some implementations, second portion of information 440 may include 22 pages of data. In some implementations, each portion 430 and 440 of information may be of an identical size.

Product code generation circuitry 120 may compute a second row code parity symbol 426 for second portion of information 440 and store second row code parity symbol 426 in storage devices 410a-c together with second portion of information 440. In some implementations, when first portion of information 430 and second portion of information 440 are identical in size, second row code parity symbol 426 may be identical in size as first row code parity symbol 424. The sizes of first and second row code parity symbols 424 and 426 may be constrained and predetermined based on the configuration and page size of the storage location of each storage device 410a-b. For example, second row code parity symbol 426 may include multiple sets of row code parity bits that are computed by row code parity symbol generation unit 210. The number of sets of row code parity bits may correspond to and be the same as the number of pages in second portion of information 440. In some implementations, each set of row code parity bits may be appended or stored together with a corresponding page of second portion of information 440. Alternatively, each set of row code parity bits may be stored in a separate storage location in one of storage devices 410. In such circumstances, each set of row code parity bits may include or be associated with information that identifies the page of data to which the set of row code parity bits correspond.

In some embodiments, second portion of information 440 may be stored in a block of each storage device 410a-c starting at a next available free page (e.g., the fourth page) of each storage device 410a-c. For example, second portion of information 440 may include 22 pages of data. The 22 pages of data may be spread across the fourth, fifth and sixth pages of storage locations of each of 7 storage devices 410*a-b* and the fourth storage location of another storage device 410. Similarly, second row code parity symbol 426 including the sets of row code parity bits may be stored together with second portion of information 440 in a similar manner.

In some embodiments, product code generation circuitry 120 may compute a second column code 460 based on second portion of information 440 and second row code parity symbol 426. Product code generation circuitry 120 may be instructed to compute second column code 460 based on a second code rate (e.g., a slow code rate corresponding to a strong column code). The second code rate used to generate second column code 460 may be slower than the first code rate used to generate first column code 450. Accordingly, second column code 460 may be larger than first column code 450. For example, second column code 460 may be two pages in size. Product code generation circuitry 120 may store second column code 460 in two separate pages of storage locations of storage devices 410*c* (e.g., in the fifth and sixth pages of storage locations of storage device 410*c*). In particular, because second column code 460 is larger than a page size of storage device 410*c*, second column code 460 may be partitioned into at least two portions where a first portion of second column code 460 is stored in one page of storage device 410*c* and a second portion of second column code 460 is stored in another page of storage device 410*c*.

In some embodiments, each stored column code may include a set of information bits. The information bits may indicate the code rate corresponding to the stored column code. The information bits may also indicate whether the stored column code is partitioned into two or more portions. In addition, the information bits may indicate where and in which storage device each one of the portions of the column code is stored. For example, a column code that is partitioned into two portions that are stored in the same storage device may include information bits with a first portion of the column code that indicate the page location in the storage device for the second portion of the column code.

In some embodiments, the pages of at least one of storage devices 410*a-c* may be used to store (1) pages or segments of portions of information 430 and 440 with corresponding sets of row code parity bits of first and second row code parity symbols 424 and 426 as well as (2) portions of column codes (e.g., second column code 460). In some implementations, the pages of at least one of storage devices 410*a-b* may be used to exclusively or only store pages or segments of portions of information 430 and 440 with corresponding sets of row code parity bits of first and second row code parity symbols 424 and 426. In some implementations, the pages of at least one of storage devices 410 may be used to exclusively or only column codes (e.g., first and second column code 450 and 460).

FIG. 5 is a diagram of an illustrative data storage unit 130 in accordance with an embodiment of the present disclosure. Data storage unit 130 may include a single storage device 500 with first and second planes 510*a-b*. The storage device may include any NAND storage devices (e.g., flash memory, MLC NAND storage devices, or other suitable electronic volatile or non-volatile storage device). Each of planes 510*a-b* of storage device 500 may be identical and may be configured to store data in blocks, where each block stores one or more pages 520 of information. In some embodiments, data storage unit 130 includes storage device 500 with a storage block having two identical planes 510*a-b*, where each of the identical planes is configured to store 192 pages per storage block.

In some embodiments, product code generation circuitry 120 may store a first portion of information 530 of information signal 112 in storage device 500. In some implementations, first portion of information 530 may include 31 pages of data. Product code generation circuitry 120 may compute a first row code parity symbol 524 for first portion of information 530 and store first row code parity symbol 524 in storage device 500 together with first portion of information 530. For example, first row code parity symbol 524 may include multiple sets of row code parity bits that are computed by row code parity symbol generation unit 210. The number of sets of row code parity bits may correspond to and be the same as the number of pages in first portion of information 530. In some implementations, each set of row code parity bits 522 may be appended or stored together with a corresponding page 520 of first portion of information 530.

In some embodiments, first portion of information 530 may be stored in one block of each plane 510*a-b* of storage device 500 at the first 16 pages of plane 510*a* and the first 15 pages of plane 510*b*. For example, first portion of information 530 may include 31 pages of data. The 31 pages of data may be spread across a set of pages of storage locations of each of plane 510*a-b*. Similarly, first row code parity symbol 524 including the sets of row code parity bits may be stored together with first portion of information 530 across the set of pages of storage locations of each plane 510*a-b* of storage devices 500.

In some embodiments, product code generation circuitry 120 may compute a first column code 550 based on first portion of information 530 and first row code parity symbol 524. Product code generation circuitry 120 may be instructed to compute first column code 550 based on a first code rate (e.g., a high code rate corresponding to a weak column code). Accordingly, first column code 550 may be one page in size. Product code generation circuitry 120 may store first column code 550 in one of planes 510*a-b* of storage device 500. In some implementations, first column code 550 may be stored in the next page of storage location in the same block as first portion of information 530 (e.g., the sixteenth page storage location of plane 510*b*).

In some embodiments, product code generation circuitry 120 may store a second portion of information 540 of information signal 112 in storage devices 500. In some implementations, second portion of information 540 may include 30 pages of data. In some implementations, each portion 530 and 540 of information may be of an identical size.

Product code generation circuitry 120 may compute a second row code parity symbol 526 for second portion of information 540 and store second row code parity symbol 526 in storage device 500 together with second portion of information 540. In some implementations, when first portion of information 530 and second portion of information 540 are identical in size, second row code parity symbol 526 may be identical in size as first row code parity symbol 524. The sizes of first and second row code parity symbols 524 and 526 may be constrained and predetermined based on the configuration and page size of the storage location of each plane 510*a-b* of storage device 500. For example, second row code parity symbol 526 may include multiple sets of row code parity bits that are computed by row code parity symbol generation unit 210. The number of sets of row code parity bits may correspond to and be the same as the number of pages in second portion of information 540. In some implementations, each set of row code parity bits may be appended or stored together with a corresponding page of second portion of information 540. Alternatively, each set of row code parity bits may be stored in a separate storage location in storage device 500. In such circumstances, each set of row code parity bits may include or be associated with information that identifies the page of data to which the set of row code parity bits correspond.

In some embodiments, second portion of information 540 may be stored in an identical size block of each plane 510*a-b* starting at a next available free page (e.g., the 176$^{th}$ page) of each plane 510*a-b*. For example, second portion of information 540 may include 30 pages of data. The 30 pages of data may be spread across pages 176-190 of storage locations of each plane 510*a-b*. Similarly, second row code parity symbol 526 including the sets of row code parity bits may be stored together with second portion of information 540 in a similar manner.

In some embodiments, product code generation circuitry 120 may compute a second column code 560 based on second portion of information 540 and second row code parity symbol 526. Product code generation circuitry 120 may be instructed to compute second column code 560 based on a second code rate (e.g., a slow code rate corresponding to a strong column code). The second code rate used to generate second column code 560 may be slower than the first code rate used to generate first column code 550. Accordingly, second column code 560 may be larger than first column code 550. For example, second column code 560 may be two pages in size. Product code generation circuitry 120 may store second column code 560 in two separate pages of storage locations of storage device 500 (e.g., in page 191 of each plane 510*a-b* of storage device 500). In particular, because second column code 560 is larger than a page size of storage device 500, second column code 560 may be partitioned into at least two portions where a first portion of second column code 560 is stored in one page of storage device 500 (e.g., in the last page of plane 510*a*) and a second portion of second column code 560 is stored in another page of storage device 500 (e.g., in the last page of plane 510*b*). Alternatively, the first and second portions of second column code 560 may both be stored in the same plane of storage device 500 (e.g., in the last two pages of plane 510*a* or 510*b*).

In some embodiments, each stored column code may include a set of information bits. The information bits may indicate the code rate corresponding to the stored column code. The information bits may also indicate whether the stored column code is partitioned into two or more portions. In addition, the information bits may indicate where and in which plane of the storage device each one of the portions of the column code is stored.

In some embodiments, the pages of plane 510*a* and plane 510*b* of storage device 500 may be used to store (1) pages or segments of portions of information 530 and 540 with corresponding sets of row code parity bits of first and second row code parity symbols 524 and 526 as well as (2) portions of column codes (e.g., second column code 560). In some implementations, the pages of plane 510*a* of storage devices 500 may be used to exclusively or only store pages or segments of portions of information 530 and 540 with corresponding sets of row code parity bits of first and second row code parity symbols 524 and 526 while the pages of plane 510*b* may be used to store column codes.

Figure 6:
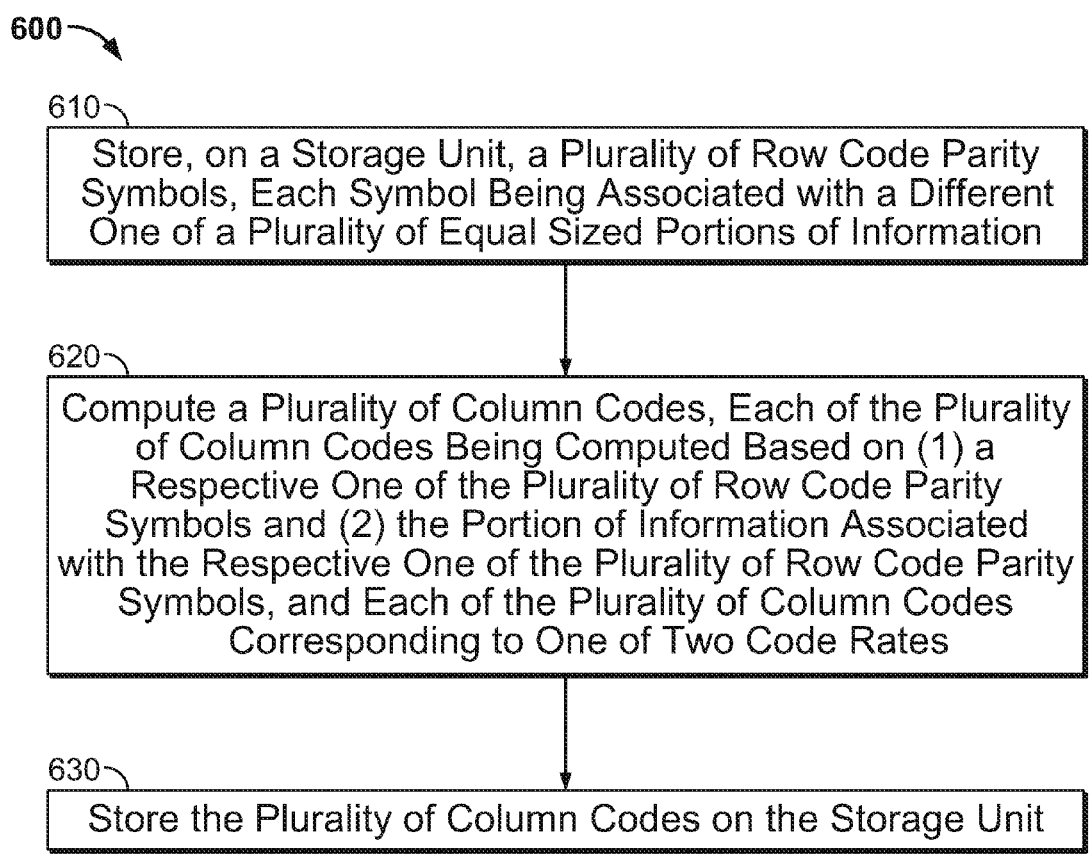
FIG. 6 illustrates a process for storing variable rate product codes in accordance with an embodiment of the present disclosure.

FIG. 6 illustrates a process 600 for storing variable rate product codes in accordance with an embodiment of the present disclosure. At 610, a plurality of row code parity symbols are stored on a storage unit, where each symbol is associated with a different one of a plurality of equal sized portions of information. For example, first row code parity symbol 324 and second row code parity symbol 326 may be stored in storage devices 310*a-b* (FIG. 3). First row code parity symbol 324 is associated with first portion of information 330 and second row code parity symbol 326 is associated with second portion of information 340 which may be equal in size to first portion of information 330.

At 620, a plurality of column codes are computed, where each of the plurality of column codes is computed based on (1) a respective one of the plurality of row code parity symbols and (2) the portion of information associated with the respective one of the plurality of row code parity symbols. Each of the plurality of column codes corresponds to one of at least two different code rates. For example, first column code 350 may be computed based on first row code parity symbol 324 and first portion of information 330 (FIG. 3). First column code 350 may correspond to a first code rate. Second column code 360 may be computed based on second row code parity symbol 326 and second portion of information 340. Second column code 360 may correspond to a second code rate that is slower than the first code rate and accordingly, second column code 360 may be larger in size (e.g., two pages in size) than first column code 350 (e.g., first column code 350 may be one page in size).

At 630, the plurality of column codes are stored on the storage unit. First column code 350 and second column code 360 may be stored in storage devices 310*b-c* of storage unit 130 (FIG. 1).

The foregoing describes systems and methods for storing variable rate product codes. The above described embodiments of the present disclosure are presented for the purposes of illustration and not of limitation. Furthermore, the present disclosure is not limited to a particular implementation. For example, one or more steps of methods described above may be performed in a different order (or concurrently) and still achieve desirable results. In addition, the disclosure may be implemented in hardware, such as on an application specific integrated circuit (ASIC) or on a field-programmable gate array (FPGA). The disclosure may also be implemented in software.

What is claimed is:

1. A method for storing variable rate product codes, the method comprising:
    storing, on a flash memory comprising a plurality of NAND storage devices, a plurality of row code parity symbols, each symbol being associated with a different one of a plurality of portions of information;
    computing a plurality of column codes that includes a first column code and a second column code, wherein the first column code is computed based on
        (1) a first of the plurality of row code parity symbols and
        (2) the portion of information associated with the first of the plurality of row code parity symbols,
    wherein the second column code is computed independently of the first of the plurality of row code parity symbols based on
        (1) a second of the plurality of row code parity symbols and
        (2) the portion of information associated with the second of the plurality of row code parity symbols, and wherein each of the plurality of column codes corresponds to one of at least two different code rates, and
    wherein at least one of the code rates is selected based on a storage location of the respective one of the plurality of row code parity symbols in the flash memory; and
    storing the plurality of column codes on the flash memory.

2. The method of claim 1, wherein the flash memory comprises a plurality of equal sized storage devices, wherein a total size of the plurality of portions of information is predetermined and corresponds to a maximum storage capacity of one of the plurality of storage devices.

3. The method of claim 1, wherein each portion of the plurality of portions of information is of equal size and corresponds to a page of data.

4. The method of claim 1, wherein the flash memory comprises a plurality of equal sized storage devices, wherein the plurality of row code parity symbols are a first plurality of row code parity symbols that are stored in a first of the plurality of storage devices, and wherein the plurality of column codes are stored in a second of the plurality of storage devices, further comprising:
storing, in a third of the plurality of storage devices, a second plurality of row code parity symbols each associated with a different one of another plurality of portions of information, wherein each of the another plurality of portions of information is of a size equal to each of the plurality of portions of information.

5. The method of claim 4, wherein:
the first column code of the plurality of column codes is computed based on a first row code parity symbol from the first plurality of row code parity symbols, the portion of information associated with the first row code parity symbol, a second row code parity symbol from the second plurality of row code parity symbols, and the portion of information associated with the second row code parity symbol;
the second column code of the plurality of column codes is computed based on a third row code parity symbol from the first plurality of row code parity symbols, the portion of information associated with the third row code parity symbol, a fourth row code parity symbol from the second plurality of row code parity symbols, and the portion of information associated with the fourth row code parity symbol; and
the first column code corresponds to a first of the at least two code rates and the second column code corresponds to a second of the at least two code rates different from the first code rate.

6. The method of claim 4, wherein some but not all of the plurality of column codes include at least two portions, and wherein a first of the at least two portions is stored in the second storage device and a second of the at least two portions is stored in a fourth of the plurality of storage devices.

7. The method of claim 1, wherein each column code that corresponds to a first of the at least two code rates is of a first size corresponding to the size of one of the plurality of portions of information, and wherein each column code that corresponds to a second of the at least two code rates is of a second size corresponding to the size of two of the plurality of portions of information.

8. The method of claim 1, wherein:
the flash memory comprises a storage device with multiple planes;
the first symbol of the plurality of row code parity symbols includes a first set of row code parity bits, each subset of the first set of row code parity bits being associated with a different equal sized segment of the portion of information that corresponds to the first symbol;
the second symbol of the plurality of row code parity symbols includes a second set of row code parity bits, each subset of the second set of row code parity bits being associated with a different equal sized segment of the portion of information that corresponds to the second symbol;
the first and second row code parity symbols are stored in each of the multiple planes; and
the first of the plurality of column codes is stored only in one of the multiple planes and the second of the plurality of column codes is stored in each of the multiple planes.

9. A system for storing variable rate product codes, the system comprising:
a flash memory comprising a plurality of NAND storage devices; and
control circuitry configured to:
store, on the flash memory, a plurality of row code parity symbols, each symbol being associated with a different one of a plurality of portions of information;
compute a plurality of column codes that includes a first column code and a second column code, wherein the first column code is computed based on
(1) a first of the plurality of row code parity symbols and
(2) the portion of information associated with the first of the plurality of row code parity symbols,
wherein the second column code is computed independently of the first of the plurality of row code parity symbols based on
(1) a second of the plurality of row code parity symbols and
(2) the portion of information associated with the second of the plurality of row code parity symbols,
wherein each of the plurality of column codes corresponds to one of at least two code rates, and wherein at least one of the code rates is selected based on a storage location of the respective one of the plurality of row code parity symbols in the flash memory; and
store the plurality of column codes on the flash memory.

10. The system of claim 9, wherein the flash memory comprises a plurality of equal sized storage devices, wherein a total size of the plurality of portions of information is predetermined and corresponds to a maximum storage capacity of one of the plurality of storage devices.

11. The system of claim 9, wherein each portion of the plurality of is of equal size portions of information and corresponds to a page of data.

12. The system of claim 9, wherein the flash memory comprises a plurality of equal sized storage devices, wherein the plurality of row code parity symbols are a first plurality of row code parity symbols that are stored in a first of the plurality of storage devices, wherein the plurality of column codes are stored in a second of the plurality of storage devices, and wherein the control circuitry is further configured to:
store, in a third of the plurality of storage devices, a second plurality of row code parity symbols each associated with a different one of another plurality of portions of information, wherein each of the another plurality of portions of information is of a size equal to each of the plurality of portions of information.

13. The system of claim 12, wherein:
the first column code of the plurality of column codes is computed based on a first row code parity symbol from the first plurality of row code parity symbols, the portion of information associated with the first row code parity symbol, a second row code parity symbol from the second plurality of row code parity symbols, and the portion of information associated with the second row code parity symbol;
the second column code of the plurality of column codes is computed based on a third row code parity symbol from the first plurality of row code parity symbols, the portion of information associated with the third row code parity symbol, a fourth row code parity symbol from the second plurality of row code parity symbols, and the portion of information associated with the fourth row code parity symbol; and the first column code corresponds to a first of the at least two code rates and the second column code corresponds to a second of the at least two code rates different from the first code rate.

14. The system of claim 12, wherein some but not all of the plurality of column codes include at least two portions, and wherein a first of the at least two portions is stored in the second storage device and a second of the at least two portions is stored in a fourth of the plurality of storage devices.

15. The system of claim 9, wherein each column code that corresponds to a first of the at least two code rates is of a first size corresponding to the size of one of the plurality of portions of information, and wherein each column code that corresponds to a second of the at least two code rates is of a second size corresponding to the size of two of the plurality of portions of information.

16. The system of claim 9, wherein:
- the flash memory comprises a storage device with multiple planes;
- the first symbol of the plurality of row code parity symbols includes a first set of row code parity bits, each subset of the first set of row code parity bits being associated with a different equal sized segment of the portion of information that corresponds to the first symbol;
- the second symbol of the plurality of row code parity symbols includes a second set of row code parity bits, each subset of the second set of row code parity bits being associated with a different equal sized segment of the portion of information that corresponds to the second symbol;
- the first and second row code parity symbols are stored in each of the multiple planes; and
- the first of the plurality of column codes is stored only in one of the multiple planes and the second of the plurality of column codes is stored in each of the multiple planes.

17. The system of claim 9 further comprising selection circuitry configured to select one of the at least two code rates, wherein the control circuitry is coupled to the selection circuitry and is further configured to compute each of the column codes based on the code rate selected by the selection circuitry.

* * * * *